(12) United States Patent
Weksler et al.

(10) Patent No.: US 10,103,699 B2
(45) Date of Patent: Oct. 16, 2018

(54) AUTOMATICALLY ADJUSTING A VOLUME OF A SPEAKER OF A DEVICE BASED ON AN AMPLITUDE OF VOICE INPUT TO THE DEVICE

(71) Applicant: Lenovo (Singapore) Pte. Ltd., New Tech Park (SG)

(72) Inventors: Arnold S. Weksler, Raleigh, NC (US); Russell Speight VanBlon, Raleigh, NC (US); John Carl Mese, Cary, NC (US); Nathan J. Peterson, Oxford, NC (US); Rod D. Waltermann, Rougemont, NC (US)

(73) Assignee: Lenovo (Singapore) Pte. Ltd., Singapore (SG)

( * ) Notice: Subject to any disclaimer, the term of this patent is extended or adjusted under 35 U.S.C. 154(b) by 0 days.

(21) Appl. No.: 15/282,789

(22) Filed: Sep. 30, 2016

(65) Prior Publication Data

US 2018/0097493 A1  Apr. 5, 2018

(51) Int. Cl.
  H03G 3/00   (2006.01)
  H04R 3/04   (2006.01)
  H04R 29/00  (2006.01)
  H03G 3/30   (2006.01)

(52) U.S. Cl.
  CPC ............ *H03G 3/3005* (2013.01); *H04R 3/04* (2013.01); *H04R 29/001* (2013.01)

(58) Field of Classification Search
  CPC .... H04R 2430/01; H04R 3/04; H04R 29/001; H03G 3/3005
  See application file for complete search history.

(56) References Cited

U.S. PATENT DOCUMENTS

| | | | | |
|---|---|---|---|---|
| 4,628,526 A * | 12/1986 | Germer | ................... | H03G 3/32 381/108 |
| 4,864,246 A * | 9/1989 | Kato | ....................... | H03G 3/32 330/129 |
| 5,666,426 A * | 9/1997 | Helms | ..................... | H03G 3/32 381/104 |
| 6,411,828 B1 * | 6/2002 | Lands | ................... | H04M 1/605 379/388.01 |
| 6,744,882 B1 * | 6/2004 | Gupta | ................ | H04M 1/6008 379/387.01 |
| 8,306,235 B2 * | 11/2012 | Mahowald | .............. | H03G 3/32 381/104 |
| 8,977,974 B2 * | 3/2015 | Kraut | ...................... | H04N 5/60 320/129 |
| 2005/0282590 A1 * | 12/2005 | Haparnas | ........... | H04M 19/044 455/570 |
| 2006/0085199 A1 * | 4/2006 | Jain | ........................ | G10L 15/26 704/275 |
| 2006/0235688 A1 * | 10/2006 | Bicego | ................... | G10L 13/04 704/254 |
| 2009/0164219 A1 * | 6/2009 | Yeung | ................... | G04C 3/002 704/258 |

(Continued)

*Primary Examiner* — Brenda C Bernardi
(74) *Attorney, Agent, or Firm* — John L. Rogitz; John M. Rogitz

(57) ABSTRACT

In one aspect, a device includes a processor and storage accessible to the processor. The storage bears instructions executable by the processor to receive, at a microphone, voice input, and to determine an amplitude of the voice input. The instructions are executable to automatically adjust a volume of a speaker based on the amplitude of the voice input.

20 Claims, 4 Drawing Sheets

(56) References Cited

U.S. PATENT DOCUMENTS

| | | | |
|---|---|---|---|
| 2009/0209293 A1* | 8/2009 | Louch | H04M 1/6041 455/566 |
| 2009/0319276 A1* | 12/2009 | Chang | G08C 17/00 704/275 |
| 2011/0213901 A1* | 9/2011 | Rostaing | G06F 3/165 710/19 |
| 2012/0015697 A1* | 1/2012 | Spencer | H04M 1/605 455/569.1 |
| 2012/0106747 A1* | 5/2012 | Crockett | H04S 7/301 381/57 |
| 2012/0257761 A1* | 10/2012 | Kumar | H03G 3/3005 381/57 |
| 2012/0263019 A1* | 10/2012 | Armstong-Muntner | G01S 15/003 367/118 |
| 2013/0078981 A1* | 3/2013 | Emery | H04M 1/605 455/418 |
| 2013/0129122 A1* | 5/2013 | Johnson | H04R 3/12 381/306 |
| 2013/0158980 A1* | 6/2013 | Landry | G06F 17/27 704/9 |
| 2013/0279706 A1* | 10/2013 | Marti | G06F 3/165 381/57 |
| 2013/0326209 A1* | 12/2013 | Dommalapati | G06F 9/4421 713/100 |
| 2014/0044286 A1* | 2/2014 | Coles | G06F 1/1688 381/150 |
| 2014/0142949 A1* | 5/2014 | Newman | G10L 15/26 704/275 |
| 2014/0297287 A1* | 10/2014 | Newman | G10L 15/08 704/275 |
| 2014/0329567 A1* | 11/2014 | Chan | H04M 1/605 455/569.2 |
| 2014/0372109 A1* | 12/2014 | Iyer | H03G 3/32 704/225 |
| 2015/0033130 A1* | 1/2015 | Scheessele | G06F 3/00 715/728 |
| 2015/0326196 A1* | 11/2015 | Park | H03G 3/20 381/107 |
| 2015/0340040 A1* | 11/2015 | Mun | G10L 17/22 704/246 |
| 2017/0012591 A1* | 1/2017 | Rider | H03G 3/3005 |
| 2017/0034323 A1* | 2/2017 | Sun | H04R 9/02 |
| 2017/0125018 A1* | 5/2017 | Landry | G10L 15/22 |
| 2017/0133011 A1* | 5/2017 | Chen | H04L 12/4625 |
| 2017/0242478 A1* | 8/2017 | Ma | H04N 9/3152 |
| 2017/0301348 A1* | 10/2017 | Chen | G10L 15/22 |

* cited by examiner

AUTOMATICALLY ADJUSTING A VOLUME OF A SPEAKER OF A DEVICE BASED ON AN AMPLITUDE OF VOICE INPUT TO THE DEVICE

FIELD

The present application relates generally to automatically adjusting a volume of a speaker of a device based on an amplitude of voice input to the device.

BACKGROUND

As recognized herein, wireless telephones and other devices have speaker volume controls that do not sense or automatically change when the user is in a volume-sensitive area. Instead, the user must manually reduce or increase the speaker volume when, for example, the volume is too high. For example, if one wants to get a voice response from a device but is in a library, at the movies, around a sleeping baby, etc., a too-high volume can be reduced only after the user manually reduces it, but the distraction of others will already have taken place.

SUMMARY

Accordingly, in one aspect a device includes a processor and storage accessible to the processor. The storage bears instructions executable by the processor to receive, at a microphone, sound input, and to determine an amplitude of the sound input. The instructions are executable to automatically adjust a volume of a speaker based on the amplitude of the sound input.

In some example non-limiting embodiments, the instructions are executable to receive, at the microphone, second sound input, and determine an amplitude of the second sound input. In such embodiments, the instructions may be executable to automatically adjust the volume of the speaker based on the amplitude of the second sound input to render a second volume, with the amplitude of the first sound input being different from the amplitude of the second sound input and with the first volume being different from the second volume.

In some implementations, the automatically adjusting may include adjusting the volume of the speaker according to a decibel level of the first sound input to render the first volume. A decibel level of the first volume may be rendered according to the decibel level of the first sound input. The respective speaker volumes can be rendered according to the respective amplitudes of voice-generated sound inputs independently of any voice recognition of words in the respective inputs.

Thus, in example non-limiting implementations the second volume may have a relationship to the first volume that is defined by a relationship of the sound level of the second input to the sound level of the first input. The respective sound levels can be average sound levels of respective inputs. Or, the respective sound levels can be root mean square sound levels of respective inputs. A sound input may be defined by an input sound having no period of no voice input sound exceeding a threshold period.

In some examples, the device may include the microphone, or the speaker, or both. The device may be implemented in a wireless communication apparatus.

In another aspect, a computer readable storage medium (CRSM) that is not a transitory signal includes instructions executable by a processor to receive a first voice input having a first amplitude, and based at least in part on the first amplitude, determine a first speaker volume to be applied to at least one speaker of a device. The instructions are executable to receive a second voice input having a second amplitude different from the first amplitude, and based at least in part on the second amplitude, render a second speaker volume to be applied to the at least one speaker. The second speaker volume is different from the first speaker volume.

In another aspect, a method includes receiving a first voice input via a microphone of a device, and determining a sound level of the first voice input. The method also includes outputting audio on at least one speaker of the device at a first volume according to the sound level of the first voice input. The method includes receiving a second voice input via the microphone of the device, and determining a sound level of the second voice input. The method includes outputting audio on the at least one speaker of the device at a second volume according to the sound level of the second voice input.

The details of present principles, both as to their structure and operation, can best be understood in reference to the accompanying drawings, in which like reference numerals refer to like parts, and in which:

DETAILED DESCRIPTION

Figure 1:
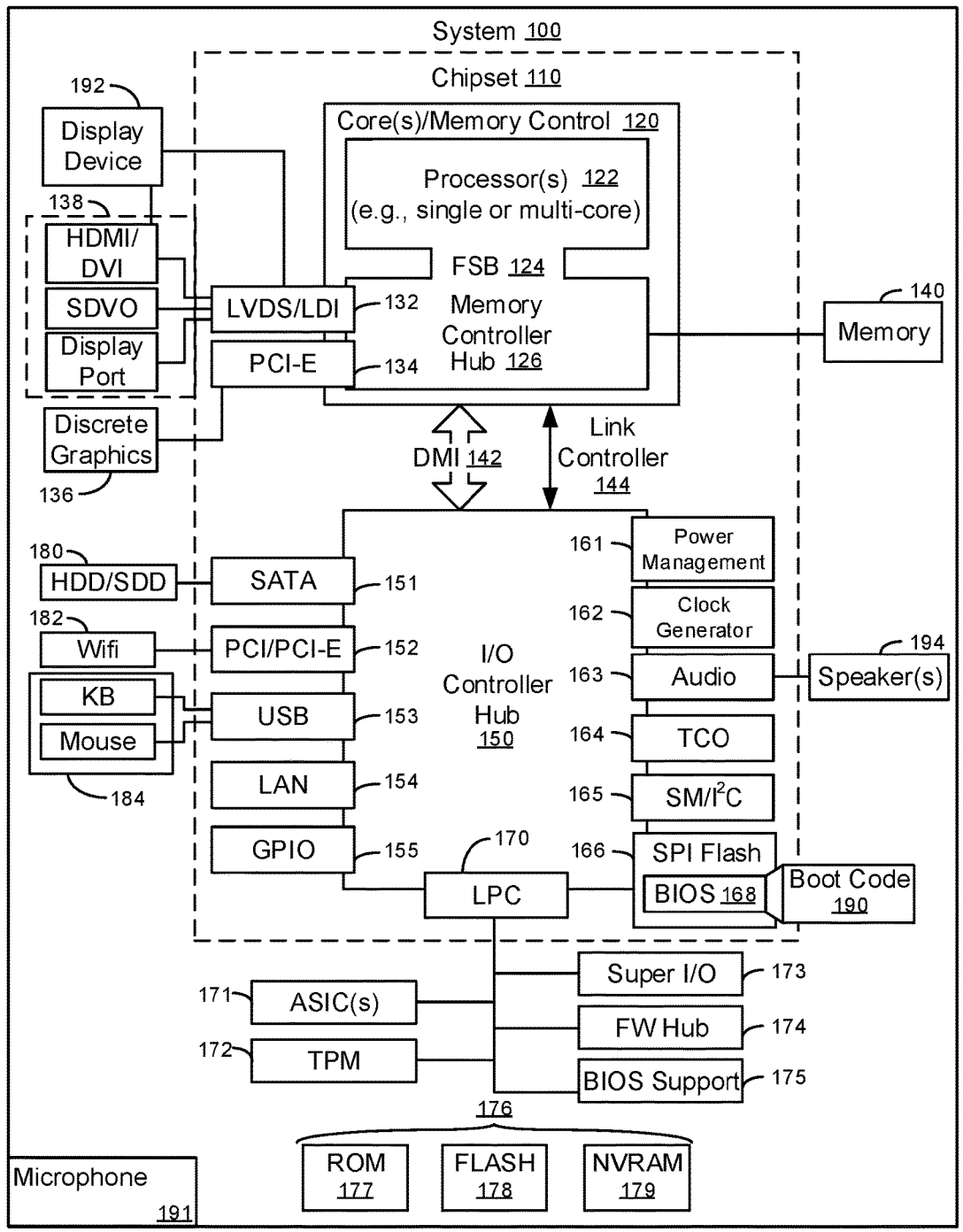
FIG. 1 is a block diagram of an example system in accordance with present principles.

With respect to any computer systems discussed herein, a system may include server and client components, connected over a network such that data may be exchanged between the client and server components. The client components may include one or more computing devices including televisions (e.g., smart TVs, Internet-enabled TVs), computers such as desktops, laptops and tablet computers, so-called convertible devices (e.g., having a tablet configuration and laptop configuration), and other mobile devices including smart phones. These client devices may employ, as non-limiting examples, operating systems from Apple, Google, or Microsoft. A Unix or similar such as Linux operating system may be used. These operating systems can execute one or more browsers such as a browser made by Microsoft or Google or Mozilla or another browser program that can access web pages and applications hosted by Internet servers over a network such as the Internet, a local intranet, or a virtual private network.

As used herein, instructions refer to computer-implemented steps for processing information in the system. Instructions can be implemented in software, firmware or hardware; hence, illustrative components, blocks, modules, circuits, and steps are sometimes set forth in terms of their functionality.

A processor may be any conventional general purpose single- or multi-chip processor that can execute logic by means of various lines such as address lines, data lines, and control lines and registers and shift registers. Moreover, any logical blocks, modules, and circuits described herein can be implemented or performed, in addition to a general purpose processor, in or by a digital signal processor (DSP), a field programmable gate array (FPGA) or other programmable logic device such as an application specific integrated circuit (ASIC), discrete gate or transistor logic, discrete hardware components, or any combination thereof designed to perform the functions described herein. A processor can be implemented by a controller or state machine or a combination of computing devices.

Any software and/or applications described by way of flow charts and/or user interfaces herein can include various sub-routines, procedures, etc. It is to be understood that logic divulged as being executed by, e.g., a module can be redistributed to other software modules and/or combined together in a single module and/or made available in a shareable library.

Logic when implemented in software, can be written in an appropriate language such as but not limited to C# or C++, and can be stored on or transmitted through a computer-readable storage medium (e.g., that is not a transitory signal) such as a random access memory (RAM), read-only memory (ROM), electrically erasable programmable read-only memory (EEPROM), compact disk read-only memory (CD-ROM) or other optical disk storage such as digital versatile disc (DVD), magnetic disk storage or other magnetic storage devices including removable thumb drives, etc.

In an example, a processor can access information over its input lines from data storage, such as the computer readable storage medium, and/or the processor can access information wirelessly from an Internet server by activating a wireless transceiver to send and receive data. Data typically is converted from analog signals to digital by circuitry between the antenna and the registers of the processor when being received and from digital to analog when being transmitted. The processor then processes the data through its shift registers to output calculated data on output lines, for presentation of the calculated data on the device.

Components included in one embodiment can be used in other embodiments in any appropriate combination. For example, any of the various components described herein and/or depicted in the Figures may be combined, interchanged or excluded from other embodiments.

The term "circuit" or "circuitry" may be used in the summary, description, and/or claims. As is well known in the art, the term "circuitry" includes all levels of available integration, e.g., from discrete logic circuits to the highest level of circuit integration such as VLSI, and includes programmable logic components programmed to perform the functions of an embodiment as well as general-purpose or special-purpose processors programmed with instructions to perform those functions.

Now specifically in reference to FIG. 1, an example block diagram of an information handling system and/or computer system 100 is shown. Note that in some embodiments the system 100 may be a desktop computer system, such as one of the ThinkCentre® or ThinkPad® series of personal computers sold by Lenovo (US) Inc. of Morrisville, N.C., or a workstation computer, such as the ThinkStation®, which are sold by Lenovo (US) Inc. of Morrisville, N.C.; however, as apparent from the description herein, a client device, a server or other machine in accordance with present principles may include other features or only some of the features of the system 100. Also, the system 100 may be, e.g., a game console such as XBOX®, and/or the system 100 may include a wireless telephone, notebook computer, and/or other portable computerized device.

As shown in FIG. 1, the system 100 may include a so-called chipset 110. A chipset refers to a group of integrated circuits, or chips, that are designed to work together. Chipsets are usually marketed as a single product (e.g., consider chipsets marketed under the brands INTEL®, AMD®, etc.).

In the example of FIG. 1, the chipset 110 has a particular architecture, which may vary to some extent depending on brand or manufacturer. The architecture of the chipset 110 includes a core and memory control group 120 and an I/O controller hub 150 that exchange information (e.g., data, signals, commands, etc.) via, for example, a direct management interface or direct media interface (DMI) 142 or a link controller 144. In the example of FIG. 1, the DMI 142 is a chip-to-chip interface (sometimes referred to as being a link between a "northbridge" and a "southbridge").

The core and memory control group 120 include one or more processors 122 (e.g., single core or multi-core, etc.) and a memory controller hub 126 that exchange information via a front side bus (FSB) 124. As described herein, various components of the core and memory control group 120 may be integrated onto a single processor die, for example, to make a chip that supplants the conventional "northbridge" style architecture.

The memory controller hub 126 interfaces with memory 140. For example, the memory controller hub 126 may provide support for DDR SDRAM memory (e.g., DDR, DDR2, DDR3, etc.). In general, the memory 140 is a type of random-access memory (RAM). It is often referred to as "system memory."

The memory controller hub 126 can further include a low-voltage differential signaling interface (LVDS) 132. The LVDS 132 may be a so-called LVDS Display Interface (LDI) for support of a display device 192 (e.g., a CRT, a flat panel, a projector, a touch-enabled display, etc.). A block 138 includes some examples of technologies that may be supported via the LVDS interface 132 (e.g., serial digital video, HDMI/DVI, display port). The memory controller hub 126 also includes one or more PCI-express interfaces (PCI-E) 134, for example, for support of discrete graphics 136. Discrete graphics using a PCI-E interface has become an alternative approach to an accelerated graphics port (AGP). For example, the memory controller hub 126 may include a 16-lane (×16) PCI-E port for an external PCI-E-based graphics card (including, e.g., one of more GPUs). An example system may include AGP or PCI-E for support of graphics.

In examples in which it is used, the I/O hub controller 150 can include a variety of interfaces. The example of FIG. 1 includes a SATA interface 151, one or more PCI-E interfaces 152 (optionally one or more legacy PCI interfaces), one or more USB interfaces 153, a LAN interface 154 (more generally a network interface for communication over at least one network such as the Internet, a WAN, a LAN, etc. under direction of the processor(s) 122), a general purpose I/O interface (GPIO) 155, a low-pin count (LPC) interface 170, a power management interface 161, a clock generator interface 162, an audio interface 163 (e.g., for speakers 194 to output audio), a total cost of operation (TCO) interface 164, a system management bus interface (e.g., a multi-master serial computer bus interface) 165, and a serial peripheral flash memory/controller interface (SPI Flash) 166, which, in the example of FIG. 1, includes BIOS 168 and boot code 190. With respect to network connections, the I/O hub controller 150 may include integrated gigabit Ethernet controller lines multiplexed with a PCI-E interface port. Other network features may operate independent of a PCI-E interface.

The interfaces of the I/O hub controller 150 may provide for communication with various devices, networks, etc. For example, where used, the SATA interface 151 provides for reading, writing or reading and writing information on one or more drives 180 such as HDDs, SDDs or a combination thereof, but in any case the drives 180 are understood to be, e.g., tangible computer readable storage mediums that are not transitory signals. The I/O hub controller 150 may also include an advanced host controller interface (AHCI) to support one or more drives 180. The PCI-E interface 152 allows for wireless connections 182 to devices, networks, etc. The USB interface 153 provides for input devices 184 such as keyboards (KB) and mice, microphones and various other devices (e.g., cameras including both visible spectrum cameras an infrared cameras such as forward looking infrared (FLIR) cameras, phones, storage, media players, etc. including input devices as may be described further below).

In the example of FIG. 1, the LPC interface 170 provides for use of one or more ASICs 171, a trusted platform module (TPM) 172, a super I/O 173, a firmware hub 174, BIOS support 175 as well as various types of memory 176 such as ROM 177, Flash 178, and non-volatile RAM (NVRAM) 179. With respect to the TPM 172, this module may be in the form of a chip that can be used to authenticate software and hardware devices. For example, a TPM may be capable of performing platform authentication and may be used to verify that a system seeking access is the expected system.

The system 100, upon power on, may be configured to execute boot code 190 for the BIOS 168, as stored within the SPI Flash 166, and thereafter processes data under the control of one or more operating systems and application software (e.g., stored in system memory 140). An operating system may be stored in any of a variety of locations and accessed, for example, according to instructions of the BIOS 168.

The system 100 may also include an audio receiver/microphone 191 that provides input from the microphone 191 to the processor 122 based on audio that is detected, such as via a user providing audible input to the microphone.

Additionally, in some embodiments the system 100 may include a gyroscope that senses and/or measures the orientation of the system 100 and provides input related thereto to the processor 122, an accelerometer that senses acceleration and/or movement of the system 100 and provides input related thereto to the processor 122, and a camera such as mentioned above for the input device 184 that gathers one or more visible and/or IR images and provides input related thereto to the processor 122. The camera may be a thermal imaging camera, an infrared (IR) camera, a digital camera such as a webcam, a three-dimensional (3D) camera, and/or a camera otherwise integrated into the system 100 and controllable by the processor 122 to gather pictures/images and/or video. Additionally, an input device 184 may be implemented by a proximity sensor such as a radiofrequency identification (RFID) sensor or IR sensor (for sensing body heat) or other proximity sensor.

Still further, the system 100 may include a GPS transceiver that is configured to receive geographic position information from at least one satellite and provide the information to the processor 122. However, it is to be understood that another suitable position receiver other than a GPS receiver may be used in accordance with present principles to determine the location of the system 100.

It is to be understood that an example client device or other machine/computer may include fewer or more features than shown on the system 100 of FIG. 1. In any case, it is to be understood at least based on the foregoing that the system 100 is configured to undertake present principles.

Figure 2:
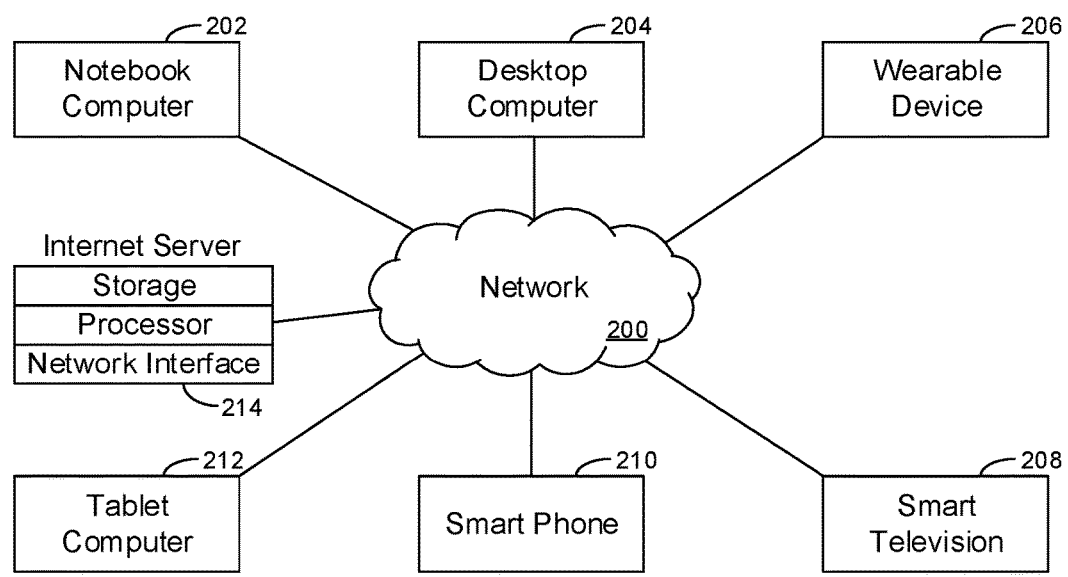
FIG. 2 is an example block diagram of a network of devices in accordance with present principles.

Turning now to FIG. 2, example devices are shown communicating over a network 200 such as the Internet in accordance with present principles. It is to be understood that each of the devices described in reference to FIG. 2 may include at least some of the features, components, and/or elements of the system 100 described above.

FIG. 2 shows a notebook computer and/or convertible computer 202, a desktop computer 204, a wearable device 206 such as a smart watch, a smart television (TV) 208, a smart phone 210, a tablet computer 212, and a server 214 such as an Internet server that may provide cloud storage accessible to the devices 202-212. It is to be understood that the devices 202-214 are configured to communicate with each other over the network 200 to undertake present principles.

As set forth in greater detail below, the volume (amplitude) of sound (such as ambient sound or a user's voice) input to the microphone of a device such as any of the devices above, e.g., such as the smart phone 210, is used to automatically adjust up or down a speaker output volume, in some cases for a temporary and/or predefined amount of time. Thus, if a user whispers a question into the device, the speaker volume settings may be modified to be at a minimum level. Alternatively, if a user screams into a device, the volume may be adjusted to be at higher volume commensurate with the spoken volume. The volume adjustment can be configured to change for all settings or can be configured to selectively adjust to the spoken response only.

Figure 3:
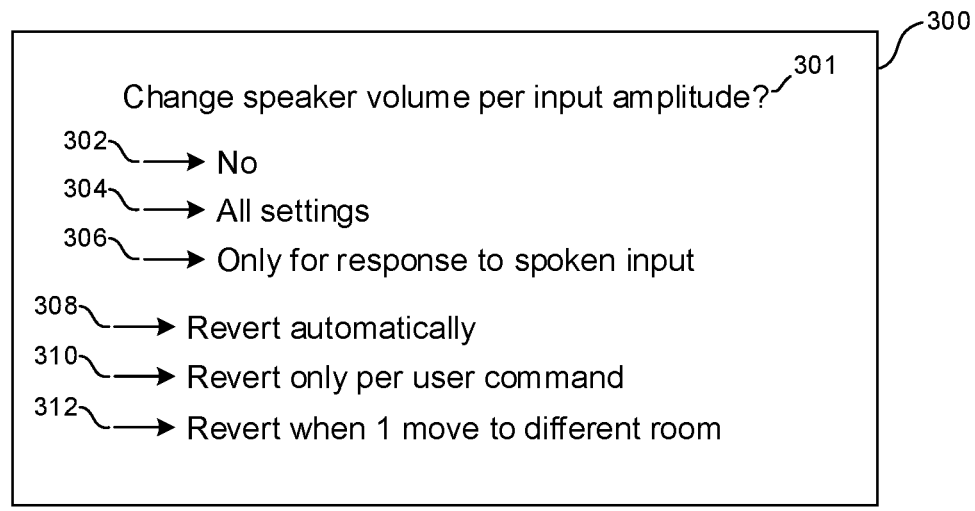
FIGS. 3 and 4 show example user interfaces (UI) that may be used.

FIG. 3 begins the illustration of the above by depicting a user interface (UI) 300 that may be presented on, for instance, a display of the smart phone 210 of FIG. 2. The UI 300 may include a prompt 301 for the user to command whether to change speaker volume for input amplitude at the device's microphone. A "no" selector 302 may be presented and may be selectable to decline to use the automatic speaker volume adjust features described herein. Also, an "all settings" selector 304 may be presented and may be selectable to cause all speaker volume settings (e.g., voice response, ringer, music output, etc.) to be changed according to the automatic speaker volume adjust features described herein. Moreover, a limited selector 306 may be presented and may be selectable to cause only a voice response speaker volume to be changed according to the automatic speaker volume adjust features described herein. The voice response typically is a response played on the speakers to a voice query input at the microphone.

In some implementations, the speaker volume can be adjusted temporarily and then revert back to the original system/volume settings by prompting the user later to revert and receiving input from the user directed to a selector on a user interface to revert. Additionally or alternatively, the speaker volume can be configured to reset after a predefined time period has elapsed from when the speaker volume was adjusted, and/or upon detection by the device of movement to another location (e.g., another room of a building). FIG. 3 illustrates that if desired, the user may be afforded a choice of the above. Accordingly, an automatic revert selector 308 may be presented and may be selectable to cause the speaker volume to revert to a preset system volume amplitude automatically, e.g., after a threshold period has elapsed from volume adjustment based on input amplitude. If desired, a user revert selector 310 may be presented and may be selectable to cause the speaker volume to revert to a preset system volume only upon user command to do so. Yet again, a change of location selector 312 may be presented and may be selectable to cause the speaker volume to revert to a preset system volume when movement of the device to a different location such as to a different room is detected, as may be determined based on input from, e.g., a GPS or other location sensor.

Figure 4:
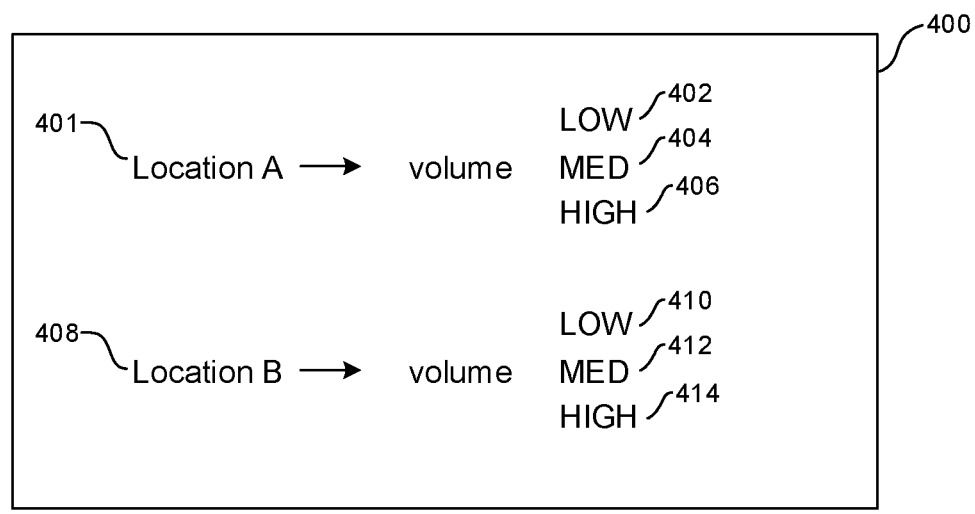

FIG. 4 illustrates a UI 400 that may be presented on the device for using location to determine whether to adjust volume. The location may be derived from the user's electronic calendar (to determine, for instance, that the user is at a concert and hence elevated volume output should be used) and/or from input from GPS and/or from RFID and/or from other location sensors. The user may be afforded a location input area 401 to define a location "A" (e.g., home, concert, work, etc.) and associated volume selectors. In the example, the volume selectors are low, medium, and high volume selectors 402, 404, 406, for automatically establishing respective low, medium, and high speaker volumes upon the device being sensed to be in location "A". Other volume selectors may be used, such as for numeric decibel input.

Likewise, the UI 400 of FIG. 4 may allow a user to define a location "B" 408 (home, concert, work, etc.) and associated volume selectors. In the example, the volume selectors are low, medium, and high volume selectors 410, 412, 414, for automatically establishing respective low, medium, and high speaker volumes upon the device being sensed to be in location "B". Other volume selectors may be used, such as for numeric decibel input.

Figure 5:
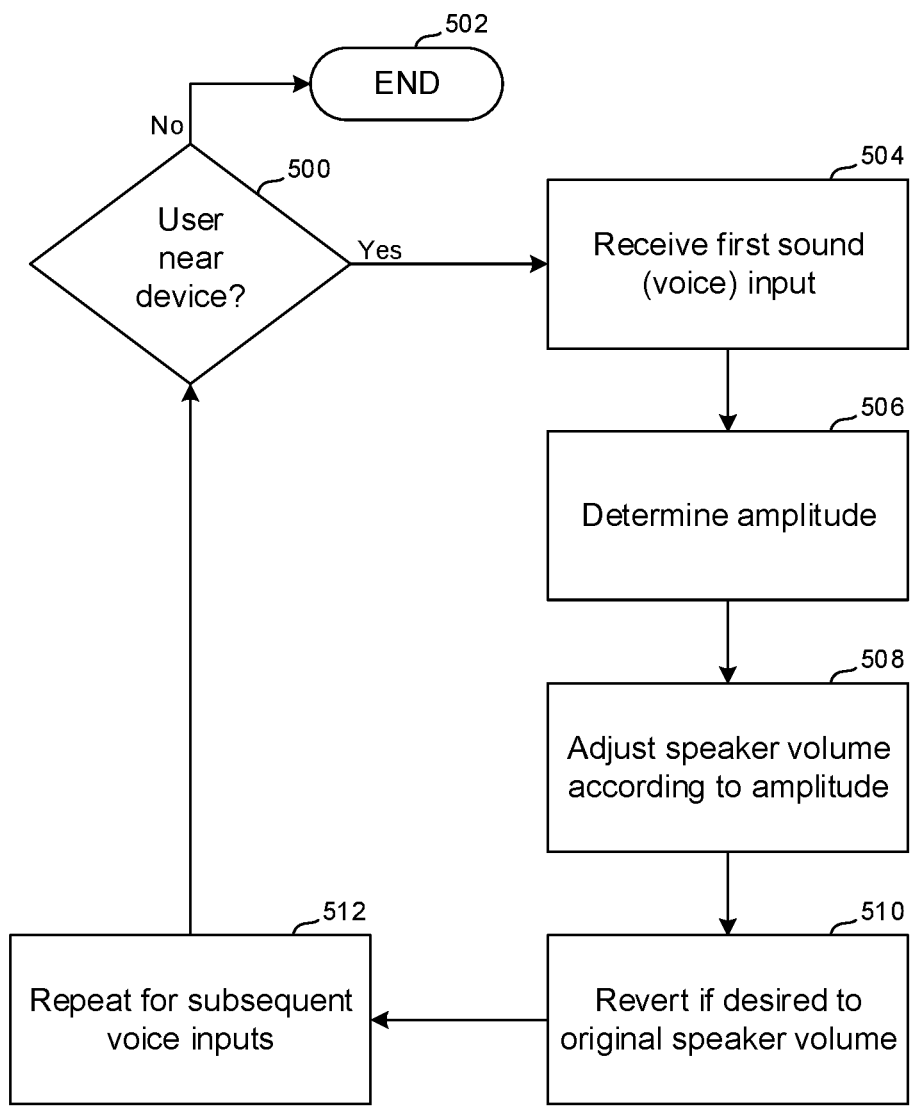
FIG. 5 is a flow chart of example logic.

FIG. 5 illustrates example logic that may be used. Commencing at decision diamond 500, it may be determined whether the user is near (e.g., within a threshold distance of) the device whose speaker volume is to be automatically adjusted based on input sound amplitude. A proximity sensor such as a heat sensor or touch sensor or RFID or even an accelerometer can be used to determine if the device is being held by the user to ensure that the distance between user and device is consistent for sound discriminating purposes. This feature eliminates the need to determine physical distance between user and device to ensure the user is not far away or in another room making it appear that the user is whispering when in fact the user is simply far away from the device. Optionally, the distance of the user can be determined by using input from one or more of a wearable device borne by the user, Bluetooth (e.g., using received signal strength identification), RFID, camera (e.g., using spatial analysis software), or other mechanism. As an example, to determine if the user is just far away from the device or if the user is nearby and speaking softly, GPS and map data may be used as well as location input from a wearable device borne by the user.

Still again, proximity of the user to the device may be determined by gyroscope or accelerometer input or other input indicating an orientation of the device that is recognized as the user is holding the device next to the user's ear (e.g., if the device is a smart phone).

When the feature of decision diamond 500 is implemented and the test is negative, the logic may end at state 502. In other embodiments, when the feature of decision diamond 500 is implemented and the test is negative, the device may decline to alter the volume level for audio output from a speaker on the device and may instead provide audio output at the then-existing and/or user-configured volume level, e.g., responsive to voice input.

Notwithstanding, it is to be understood that in other embodiments when the user is determined to not be near the device but instead be, e.g., at least a threshold distance away, the volume level may be increased, e.g., responsive to voice input. The volume may even be increased incrementally to respective higher levels that are respectively correlated to increasing threshold distances away from the device at which the user may be identified.

However, when the feature of decision diamond 500 is implemented and it is determined that the user is near the device, the logic may flow to block 504 to receive a first sound input, such as a first voice input.

Proceeding to block 506, the amplitude of the first sound input is determined. The amplitude may be an average sound level of the first sound input, or it may be a root mean square sound level of the input, or other measurement indicating the sound level of the input. A sound input may be defined by an input sound having no period of no voice input sound exceeding a threshold period, so that a pause between sound inputs of greater than a threshold period, for instance, may indicate two different inputs with two different sound levels and thus two different speaker volume adjustments.

Moving from block 506 to block 508, based on the amplitude determined at block 506 the output volume of the speaker(s) of the device may be automatically adjusted up or down. In some implementations, the automatic adjusting may include adjusting the volume of the speaker according to a decibel level of the first sound input to render the first volume. A decibel level of the first volume may be rendered according to the decibel level of the first sound input. The respective speaker volumes can be rendered according to the respective amplitudes of voice-generated sound inputs independently of any voice recognition of words in the respective inputs. Note that the adjusted volume can be for speakerphone volume, ear piece speaker volume, Bluetooth speaker volume, or volume for another, separate speaker.

At block 510 the original speaker volume as it existed prior to block 508 may be restored if desired according to the principles illustrated in FIG. 3. Moving to block 512, the automatic adjust logic of FIG. 5 may be repeated for subsequent voice inputs. Thus, an amplitude of second sound input may be determined to automatically adjust the volume of the speaker of the device responsive to the amplitude of the second sound input to render a second volume, with the amplitude of the first sound input being different from the amplitude of the second sound input and with the first volume being different from the second volume. Accordingly, in example non-limiting implementations the second volume may have a relationship to the first volume that is defined by a relationship of the sound level of the second input to the sound level of the first input.

Note that responsive to determining that the device is being held to the person's ear, speaker volume may be reduced. As another example, responsive to a determination that the device is oriented generally horizontally it may be inferred that the device is distanced from the user, and hence volume should be higher. Thus, the device sensing it is moving from a "regular" phone position against a user's ear to a more horizontal phone position for speaker phone conversation, using a gyroscope for example, may cause the device to automatically switch from normal phone mode (e.g., earpiece speaker output only) to a speaker phone mode without the user having to select any buttons to make the switch. An accelerometer may also be used to detect the gesture, in addition to or in lieu of the gyroscope (e.g., quick motion during telephone call of at least a certain amount).

The above principles apply to devices other than smart phones. For example, the principles above may apply to adjusting the speaker volumes of music players, video players, etc.

Before concluding, it is to be understood that although a software application for undertaking present principles may be vended with a device such as the system 100, present principles apply in instances where such an application is downloaded from a server to a device over a network such as the Internet. Furthermore, present principles apply in instances where such an application is included on a computer readable storage medium that is being vended and/or provided, where the computer readable storage medium is not a transitory signal and/or a signal per se.

It is to be understood that whilst present principals have been described with reference to some example embodiments, these are not intended to be limiting, and that various alternative arrangements may be used to implement the subject matter claimed herein. Components included in one embodiment can be used in other embodiments in any appropriate combination. For example, any of the various components described herein and/or depicted in the Figures may be combined, interchanged or excluded from other embodiments.

What is claimed is:

1. A device, comprising:
   at least one processor;
   at least one microphone accessible to the at least one processor;
   at least one speaker accessible to the at least one processor; and
   storage accessible to the at least one processor and bearing instructions executable by the at least one processor to:
   receive, via the at least one microphone, first sound input;
   determine an amplitude of the first sound input;
   automatically adjust a volume for the at least one speaker based on the amplitude of the first sound input to render a first volume; and
   responsive to identification of the passage of a predefined amount of time, revert back to a second volume for the at least one speaker, the second volume being different from the first volume.

2. The device of claim 1, wherein the device comprises at least one accelerometer, and wherein the instructions are executable by the at least one processor to:
   automatically adjust a volume for the at least one speaker based on input from the accelerometer being indicative of motion above a threshold amount.

3. The device of claim 1, wherein the instructions are executable by the at least one processor to:
   responsive to identification of a change of location of the device, revert back to a third volume for the at least one speaker, the third volume being different from the first volume.

4. The device of claim 1, wherein the instructions are executable by the at least one processor to:
   responsive to receipt of a selection of a selector presented on a display of the device, revert back to a third volume for the at least one speaker, the third volume being different from the first volume.

5. The device of claim 1, wherein the first volume is rendered for a ringer of the device.

6. The device of claim 1, wherein the amplitude is determined based on a root mean square of the first sound input.

7. A computer readable storage medium (CRSM) that is not a transitory signal, the computer readable storage medium comprising instructions executable by at least one processor of a device to:
   receive input from at least one orientation sensor;
   based at least in part on the input, switch from one of a speaker phone mode and a non-speaker phone mode to the other of the speaker phone mode and the non-speaker phone mode;
   wherein the at least one orientation sensor comprises an accelerometer, wherein the input is received from the accelerometer, and wherein the instructions are executable by the at least one processor to:
   perform the switch based on the input from the accelerometer being indicative of motion above a threshold amount.

8. The CRSM of claim 7, wherein the instructions are executable by the at least one processor to:
   determine that the device is being held to a user's ear based on the input; and
   switch from the speaker phone mode to the non-speaker phone mode based on the determination that the device is being held to the user's ear.

9. The CRSM of claim 7, wherein the instructions are executable by the at least one processor to:
   determine that the device is not being held to a user's ear based on the input; and
   switch from the non-speaker phone mode to the speaker phone mode based on the determination that the device is not being held to the user's ear.

10. A method, comprising:
    receiving, via at least one microphone, first sound input;
    determining, using a device in communication with the microphone, an amplitude of the first sound input;
    automatically adjusting, using the device, a volume for at least one speaker based on the amplitude of the first sound input to render a first volume; and
    responsive to identifying the passage of a predefined amount of time, reverting back to a second volume for the at least one speaker, the second volume being different from the first volume.

11. The method of claim 10, comprising:
    automatically adjusting a volume for the at least one speaker based on input from an accelerometer being indicative of motion of the device above a threshold amount.

12. The method of claim 10, comprising:
    responsive to identifying of a change of location of the device, reverting back to a third volume for the at least one speaker, the third volume being different from the first volume.

13. The method of claim 10, comprising:
    responsive to receiving a selection of a selector presented on an electronic display, reverting back to a third volume for the at least one speaker, the third volume being different from the first volume.

14. The method of claim 10, wherein the amplitude is determined based on a root mean square of the first sound input.

15. The method of claim 10, comprising:
    receiving input from at least one location sensor in communication with the device, the input indicating a current location of the device; and
    outputting, based on the input from the at least one location sensor, audio on the at least one speaker at a predefined volume.

16. The method of claim 15, wherein the predefined volume is identified based at least in part on receipt of user input directed to a selector presented on an electronic display as part of a graphical user interface (GUI), the GUI indicating the current location and the selector associated with the current location on the GUI.

17. The method of claim 15, wherein the input from the at least one location sensor indicates the current location in global positioning system (GPS) coordinates.

18. The method of claim 15, wherein the at least one location sensor comprises a radio-frequency identification (RFID) sensor.

19. The method of claim 10, comprising:
increasing volume for the at least one speaker responsive to determining that the device has moved more than a threshold distance away from a user.

20. The method of claim 10, comprising:
incrementally increasing volume for the at least one speaker as the device moves farther away from a user.

* * * * *